United States Patent
Cobb et al.

(10) Patent No.: US 12,237,289 B2
(45) Date of Patent: Feb. 25, 2025

(54) FLEXIBLE ELECTRONIC STRUCTURE INCLUDING A SUPPORT ELEMENT

(71) Applicant: PRAGMATIC SEMICONDUCTOR LIMITED, Cambridge (GB)

(72) Inventors: Brian Cobb, Sedgefield Durham (GB); Richard Price, Sedgefield Durham (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 432 days.

(21) Appl. No.: 17/611,611

(22) PCT Filed: May 19, 2020

(86) PCT No.: PCT/GB2020/051221
§ 371 (c)(1),
(2) Date: Nov. 16, 2021

(87) PCT Pub. No.: WO2020/234582
PCT Pub. Date: Nov. 26, 2020

(65) Prior Publication Data
US 2022/0238472 A1     Jul. 28, 2022

(30) Foreign Application Priority Data
May 21, 2019   (GB) ..................... 1907158

(51) Int. Cl.
*H01L 23/498*   (2006.01)
*H01L 23/00*    (2006.01)
(Continued)

(52) U.S. Cl.
CPC ............ *H01L 24/19* (2013.01); *H01L 23/367* (2013.01); *H01L 23/4985* (2013.01);
(Continued)

(58) Field of Classification Search
CPC . H01L 23/4985; H01L 23/5225; H01L 24/05; H01L 24/16; H01L 24/19;
(Continued)

(56) References Cited

U.S. PATENT DOCUMENTS

| 5,120,665 A | 6/1992 | Tsukagoshi et al. |
| 5,804,882 A * | 9/1998 | Tsukagoshi ............. H01L 24/83 |
| | | 257/E21.511 |

(Continued)

FOREIGN PATENT DOCUMENTS

| DE | 3924439 A | 4/1991 |
| EP | 1093160 A2 | 4/2001 |

(Continued)

OTHER PUBLICATIONS

Examination Report Under Section 18(3) for Great Britain Application No. 1907158.8, mailed Aug. 29, 2023.
(Continued)

*Primary Examiner* — Khiem D Nguyen
(74) *Attorney, Agent, or Firm* — Jason H. Vick; AMPED IP LLC

(57) ABSTRACT

There is provided a flexible electronic structure for bonding with an external circuit. The flexible electronic structure comprising: a flexible body having a first surface, the flexible body comprising at least one electronic component; at least one contact element configured to bond with the external circuit, the at least one contact element operatively coupled with the at least one electronic component and provided at the first surface of the flexible body, and arranged to operably interface with the external circuit after bonding, and at least one support element provided at the first surface of the flexible body, each support element
(Continued)

arranged to contact a corresponding surface element disposed on a first surface of an external structure comprising the external circuit.

12 Claims, 7 Drawing Sheets

(51) Int. Cl.
    *H01L 23/367* (2006.01)
    *H01L 23/522* (2006.01)
    *H05K 1/18* (2006.01)

(52) U.S. Cl.
    CPC ........ *H01L 23/5225* (2013.01); *H01L 23/562* (2013.01); *H01L 24/05* (2013.01); *H01L 24/16* (2013.01); *H01L 24/20* (2013.01); *H01L 24/32* (2013.01); *H01L 24/83* (2013.01); *H05K 1/181* (2013.01); *H01L 24/81* (2013.01); *H01L 24/82* (2013.01); *H01L 2224/03318* (2013.01); *H01L 2224/04105* (2013.01); *H01L 2224/16265* (2013.01); *H01L 2224/16268* (2013.01); *H01L 2224/2919* (2013.01); *H01L 2224/32268* (2013.01); *H01L 2224/81203* (2013.01); *H01L 2224/81898* (2013.01); *H01L 2224/83203* (2013.01); *H01L 2224/83851* (2013.01); *H01L 2924/30105* (2013.01); *H01L 2924/3025* (2013.01); *H01L 2924/3511* (2013.01); *H01L 2924/3512* (2013.01)

(58) Field of Classification Search
    CPC ......... H01L 24/20; H01L 24/32; H01L 24/81; H01L 24/82; H01L 24/83; H01L 2224/03318; H01L 2224/04105; H01L 2224/16265; H01L 2224/16268; H01L 2224/2929; H01L 2224/32268; H01L 2224/81203; H01L 2224/83203; H01L 2224/83581; H01L 2924/30105; H01L 2924/3025; H01L 2924/3511; H01L 2924/3512; H01L 23/645; H01L 23/562; H05K 1/181
    See application file for complete search history.

(56) References Cited

U.S. PATENT DOCUMENTS

| | | | |
|---|---|---|---|
| 5,953,589 A * | 9/1999 | Shim | H01L 23/4334 257/E23.092 |
| 6,069,026 A | 5/2000 | Terrill et al. | |
| 6,346,750 B1 * | 2/2002 | Jiang | C09J 9/02 257/781 |
| 8,083,150 B2 * | 12/2011 | Sakurai | H01L 24/29 235/487 |
| 8,766,284 B1 | 7/2014 | Dutta | |
| 10,134,685 B1 | 11/2018 | Chen et al. | |
| 2002/0105078 A1 * | 8/2002 | Lee | H05K 3/323 257/773 |
| 2002/0196614 A1 * | 12/2002 | DiBene, II | H05K 1/144 257/E23.09 |
| 2003/0057550 A1 | 3/2003 | Zhao et al. | |
| 2008/0067656 A1 | 3/2008 | Leung et al. | |
| 2008/0150093 A1 | 6/2008 | Jang et al. | |
| 2010/0214759 A1 | 8/2010 | Beddingfield et al. | |
| 2010/0244222 A1 | 9/2010 | Chi et al. | |
| 2010/0290191 A1 | 11/2010 | Lin et al. | |
| 2011/0090658 A1 * | 4/2011 | Adams | H01L 23/573 427/7 |
| 2011/0140258 A1 | 6/2011 | Do et al. | |
| 2011/0147901 A1 | 6/2011 | Huang et al. | |
| 2011/0227209 A1 | 9/2011 | Yoon et al. | |
| 2012/0139091 A1 | 6/2012 | Wakabayashi | |
| 2014/0003011 A1 | 1/2014 | Kato et al. | |
| 2014/0021264 A1 | 1/2014 | Pueschner et al. | |
| 2014/0361427 A1 * | 12/2014 | Kim | H01L 23/49811 257/737 |
| 2014/0361428 A1 | 12/2014 | Park | |
| 2015/0014862 A1 | 1/2015 | Kwon et al. | |
| 2015/0077949 A1 | 3/2015 | Baek et al. | |
| 2015/0091149 A1 | 4/2015 | Jang et al. | |
| 2015/0278675 A1 * | 10/2015 | Finn | G06K 19/07783 29/601 |
| 2016/0056127 A1 | 2/2016 | Lee | |
| 2016/0254761 A1 * | 9/2016 | Furukawa | H01L 21/283 363/131 |
| 2017/0025593 A1 | 1/2017 | Bower et al. | |
| 2017/0194263 A1 | 7/2017 | Kato | |
| 2017/0278830 A1 | 9/2017 | Kim | |
| 2018/0006008 A1 | 1/2018 | Lin et al. | |
| 2018/0053732 A1 | 2/2018 | Baek et al. | |
| 2018/0166405 A1 | 6/2018 | Chiang et al. | |
| 2018/0233457 A1 | 8/2018 | Chen et al. | |
| 2018/0247905 A1 | 8/2018 | Yu et al. | |
| 2018/0261557 A1 | 9/2018 | Yu et al. | |
| 2019/0006289 A1 | 1/2019 | Hunag et al. | |
| 2019/0123004 A1 | 4/2019 | Chang et al. | |
| 2020/0006310 A1 | 1/2020 | Hu et al. | |
| 2020/0013735 A1 | 1/2020 | Liu et al. | |
| 2020/0035625 A1 | 1/2020 | Wang et al. | |
| 2020/0051882 A1 | 2/2020 | Watanabe et al. | |
| 2020/0176376 A1 | 6/2020 | Ndip et al. | |
| 2020/0294980 A1 | 9/2020 | Otsubo et al. | |
| 2020/0312821 A1 | 10/2020 | Yan et al. | |
| 2020/0321288 A1 | 10/2020 | Huang et al. | |
| 2021/0013585 A1 | 1/2021 | Ho et al. | |
| 2021/0020559 A1 | 1/2021 | Hung et al. | |
| 2021/0098391 A1 | 4/2021 | Wu et al. | |
| 2021/0242117 A1 | 8/2021 | Hung et al. | |
| 2022/0181267 A1 | 6/2022 | Kung et al. | |
| 2022/0320020 A1 | 10/2022 | Hsu et al. | |

FOREIGN PATENT DOCUMENTS

| | | |
|---|---|---|
| GB | 2581149 A | 8/2020 |
| KR | 10-2015-0001125 A | 1/2015 |
| WO | WO 2007/061216 A1 | 5/2007 |

OTHER PUBLICATIONS

International Preliminary Report on Patentability for International Application No. PCT/GB2020/051219, mailed Dec. 2, 2021.
International Preliminary Report on Patentability for International Application No. PCT/GB2020/051221, mailed Dec. 2, 2021.
International Preliminary Report on Patentability for International Application No. PCT/GB2020/051222, mailed Dec. 2, 2021.
Gupta, Shoubhik et al. "Ultra-Thin Chips for High-Performance Flexible Electronics" Nature Partner Journals; Mar. 14, 2018.
Johnson Electric "Parlex Options for Shielding Flexible Printed Circuits and Shielded Flexible Flat Cable" Available at https://www.johnsonelectric.com/en/resources-for-engineers/flat-flexible-cables/flat-flexible-cables-design-considerations/flat-flexible-cables-design-considerations-parlex-options-for-shielding-flexible-printed-circuits-and-shielded-flexible-flat-cable; Date Unknown.
Kamikoriyama, Yoichi et al. "Ambient Aqueous-Phase Synthesis of Copper Nanoparticles and Nanopastes with Low-Temperature Sintering and Ultra-High Bonding Abilities" Scientific Reports; Jan. 29, 2019.
Sekitani, Tsuyoshi et al. "Human-Friendly Organic Integrated Circuits" Materials Today; vol. 14, No. 9; Sep. 2011.
U.S. Appl. No. 17/611,604, filed Nov. 16, 2021, Cobb et al.
U.S. Appl. No. 17/611,614, filed Nov. 16, 2021, Williamson et al.
Hassan, Mahadi-Ul et al. "Assembly and Embedding of Ultra-Thin Chips in Polymers" XP032547032; EMPC 2013, Grenoble, France; Sep. 9, 2013.
Hollman, Richard et al. "Ultra Fine RDL Structure Fabrication Using Alternative Patterning and Botom-Up Plating Processes"

(56) References Cited

OTHER PUBLICATIONS

XP033383278; 2018 IEEE 68th Electronic Components and Technology Conference; May 19, 2018.
Mashayekhi, Mohammad et al. "Chip-by-Chip Configurable Interconnection Using Digital Printing Techniques" XP020314891; Journal of Micromechanics and Microengineering; vol. 27, No. 4; Mar. 6, 2017.
Invitation to Pay Additional Fees and, Where Applicable, Protest Fee for International Application No. PCT/GB2020/051219, mailed Aug. 21, 2020.
International Search Report for International Application No. PCT/GB2020/051219, mailed Oct. 13, 2020.
Written Opinion for International Application No. PCT/GB2020/051219, mailed Oct. 13, 2020.
Search Report for Great Britain Application No. 1907158.8, mailed Oct. 24, 2019.
Invitation to Pay Additional Fees and, Where Applicable, Protest Fee for International Application No. PCT/GB2020/051221, mailed Aug. 24, 2020.
International Search Report for International Application No. PCT/GB2020/051221, mailed Oct. 22, 2020.
Written Opinion for International Application No. PCT/GB2020/051221, mailed Oct. 22, 2020.
Invitation to Pay Additional Fees and, Where Applicable, Protest Fee for International Application No. PCT/GB2020/051222, mailed Aug. 27, 2020.
International Search Report for International Application No. PCT/GB2020/051222, mailed Oct. 19, 2020.
Written Opinion for International Application No. PCT/GB2020/051222, mailed Oct. 19, 2020.
U.S. Appl. No. 17/611,604, filed Nov. 16, 2021.
U.S. Appl. No. 17/611,614, filed Nov. 16, 2021.
Examination Report Under Section 18(3) for Great Britain Application No. 1907158.8, mailed Nov. 21, 2023.
Examiner's Report of Telephone Conversation for Great Britain Application No. 1907158.8, mailed Dec. 14, 2023.
Intention to Grant Under Section 18(4) for Great Britain Application No. 1907158.8, mailed Jan. 10, 2024.
Office Action (Restriction Requirement) for U.S. Appl. No. 17/611,614, mailed May 1, 2024.
Office Action (Restriction Requirement) for U.S. Appl. No. 17/611,614, mailed May 13, 2024.
Office Action for U.S. Appl. No. 17/611,604, mailed Mar. 7, 2024.
Office Action for U.S. Appl. No. 17/611,604, mailed Jul. 22, 2024.
Office Action for U.S. Appl. No. 17/611,604, mailed Sep. 25, 2024.
Office Action for U.S. Appl. No. 17/611,614, mailed Aug. 27, 2024.

* cited by examiner

FLEXIBLE ELECTRONIC STRUCTURE INCLUDING A SUPPORT ELEMENT

CROSS-REFERENCE TO RELATED APPLICATIONS

This application is a national stage application under 35 U.S.C. 371 of PCT Application No. PCT/GB2020/051221 having an international filing date of 19 May 2020, which designated the United States, which PCT application claimed the benefit of Great Britain Application No. 1907158.8, filed 21 May 2019, each of which are incorporated herein by reference in their entirety.

The present invention relates generally to the field of electrical circuits and microchips and relates in particular to an improved flexible electronic structure, such as, for example, a thin-film integrated circuit (IC), that is adapted for bonding with an external circuit. More specifically, the present invention relates to a flexible electronic structure configured for improved protection of its electronic components during bonding.

BACKGROUND

In the past decade, flexible circuitry has been branching out significantly from its initial role as a simple wire replacement to providing very cost-effective, but more complex interconnects, as well as, low-cost flexible integrated circuits (ICs) that can easily be embedded into everyday objects.

A flexible circuit structure, such as, for example, a flexible integrated or printed circuit (i.e. IC), is a patterned arrangement of circuitry and components that utilises flexible base material with or without flexible over lay. In particular, the flexible circuit structure (e.g. flexible IC or thin-film IC) may be formed in a thin layer of soft polymer film so that the flexible circuit structure can be bent or even stretched while maintaining integrity and functionality of the integrated circuit. Also, in contrast to a rigid silicon wafer IC, flexible circuit structures have usually no further protection, such as a hard, outer plastic case, and may therefore be vulnerable to damage.

According to a conventional method, ICs, whether rigid or flexible, are attached to substrates using conductive adhesives, such as anisotropic conductive adhesive (ACA, an example of which is an anisotropic conductive paste (ACP)). ACA consists of an adhesive organic binder with a filling material of conductive particles forming a paste. An alternative approach is to sinter conductive metallic inks to simultaneously form solid metal and join the IC to the substrate, where this is known as intermetallic bonding. Recently, a copper nanoink has been used for such a die attach purpose.

With regards to the first bonding method mentioned above, the adhesive (e.g., ACA) is placed between a flexible circuit structure and respective contacts of an application circuit. A bonding tool (e.g., thermodes) is then used to press (while applying heat) the conductive particles into respective contacts, or bonding pads, of the flexible circuit structure and the application circuit forming an electrically conductive interface between the flexible circuit structure and the application circuit. Since the conductive particles are isolated within the non-conductive adhesive matrix, no lateral conduction takes place. The binder cures thermally to secure the bond between the flexible circuit structure and the application circuit.

However, conventionally there may be a relatively wide space between the contacts of the flexible circuit structure. A consequence of this is that, as a result of the bonding process, the flexible circuit structure may become distorted in an undesirable manner. For example, the flexible circuit structure may adopt a less controlled form, such as being less planar and/or less closely conforming to the shape of the external application circuit (or a substrate/structure comprising the external application circuit, which may itself be flexible). In some cases, this could result in damage to the flexible circuit structure.

FIGS. 1A, 1B and 1C illustrate a conventional structure and bonding process, where a flexible electronic structure 20 (such as a flexible IC) is bonded to an external structure 10 (such as an application circuit or an external structure including an application circuit).

Flexible electronic structure 20 includes flexible body 22, contact elements 24 (which it will be appreciated could also be referred to as contacts, bond pads, contact members etc.), and one or more integrated electronic components 26. Referring to the above, it will be appreciated that an ACA may be provided between the flexible electronic structure 20 and the external structure 10.

The one or more electronic components 26, which may comprise any of resistors, capacitors, transistors, diodes, inductors, etc., are embedded within the flexible body 22, and are operatively coupled to the contact elements 24. In a case where there are more than two contact elements, the embedded circuit may be operatively coupled to at least two of the contact elements.

The contact elements 24 are provided, or formed, on a first surface of the flexible body 22. For example, the contact elements 24 are formed from a conductive layer which is disposed on the flexible body 22, where the remaining part of the conductive layer is removed in the process of formation of the contact elements 24.

External structure 10 includes a substrate 12 and external contact elements 14. The external contact elements 14 are disposed, or provided, on a first surface of the substrate 12 which opposes the first surface of the flexible electronic structure 20. The external contact elements 14 are provided to correspond to the contact elements 24 of the flexible electronic structure.

As shown in FIG. 1B, upon suitably positioning the flexible electronic structure 20 and the external structure 10 to ensure appropriate alignment of the contact elements 24 and the external contact elements 14, pressure is applied to a second surface of the flexible electronic structure 20, opposite to the first surface, and pressure is applied to a second surface of the external structure 10, opposite to the first surface, thereby pressing the flexible electronic structure 20 and the external structure 10 together through the ACA (not shown). The applied pressure is illustrated by the arrows. In addition to the applied pressure, one or more of the flexible electronic structure 20, the external structure 10 and the ACA may be heated. This results in the bonding and electrical connection between the contact elements 24 and the external contact elements 14.

FIG. 10 illustrates the problem which is discussed above, in that the flexible electronic structure has deformed, or lost planarity, as a result of the bonding process.

BRIEF SUMMARY OF THE DISCLOSURE

It is an aim of certain examples of the present disclosure to address an issue of loss of control of the form of a flexible circuit structure, particularly as a result of a bonding process to an external structure.

In accordance with an aspect of the present disclosure, there is provided a flexible electronic structure for bonding with an external circuit, the flexible electronic structure comprising: a flexible body having a first surface, the flexible body comprising at least one electronic component; at least one contact element configured to bond with the external circuit, the at least one contact element operatively coupled with the at least one electronic component and provided at the first surface of the flexible body, and arranged to operably interface with the external circuit after bonding, and at least one support element provided at the first surface of the flexible body, each support element arranged to contact a corresponding surface element disposed on a first surface of an external structure comprising the external circuit.

In an example of the present disclosure, one or more of the at least one support element, the at least one contact element, the external circuit and the corresponding surface element comprises a conductive metallic ink.

In another example of the present disclosure, the at least one support element is arranged to provide optical shielding of one or more of the at least one electronic component.

In another example of the present disclosure, the at least one support element is arranged to provide shielding to one or more of electro-magnetic interference and radiation, for one or more of the at least one electronic component.

In another example of the present disclosure, the at least one support element is thermally connected to the at least one electronic component.

In another example of the present disclosure, the at least one support element provides heat spreading or heat sinking for the at least one electronic component.

In another example of the present disclosure, the at least one support element and the at least one contact element are formed on the first surface by one of a photolithographic technique, laser ablation and printing.

In another example of the present disclosure, wherein the at least one support element and the at least one contact element comprise the same one or more materials.

In another example of the present disclosure, the flexible electronic structure comprises a plurality of contact elements, wherein the at least one support element is provided between two contact elements of the plurality of contact elements.

In another example of the present disclosure, the flexible electronic structure comprises a plurality of support elements, each arranged to contact and electrically connect to a corresponding surface element disposed on the surface of external structure, wherein each surface element is an antenna track.

In another example of the present disclosure, a thermoplastic is provided around the at least one support element to form an underfill between the flexible electronic structure and the external structure.

In another example of the present disclosure, the at least one contact element and the at least one support element are formed in a redistributive layer, RDL, of the flexible electronic structure.

In another example of the present disclosure, each support element is configured to bond with the corresponding surface element via a conductive, adhesive, curable fluid, or via sintered metallic ink.

In another example of the present disclosure, at least one of: a contact element of the at least one contact element is formed to have one or more protrusions arranged to penetrate a corresponding contact element of the external circuit during bonding; a contact element of the at least one contact element is arranged to be penetrated by one or more protrusions of a corresponding contact element of the external during bonding; and a contact element of the at least one contact element is formed to have one or more protrusions arranged to penetrate an electronic component of the external circuit during bonding In another example of the present disclosure, the one or more protrusions are for forming an electrical connection to the external circuit when the flexible electronic structure is bonded with the external circuit.

In another example of the present disclosure, the electrical connection to the external circuit is for the communication of signals to be transmitted by or received by an antenna of the external circuit.

In another example of the present disclosure, a non-conductive adhesive fluid is provided between the flexible electronic structure and the external structure.

In another example of the present disclosure, the flexible electronic structure is a thin-film integrated circuit, IC, or a flexible IC.

BRIEF DESCRIPTION OF THE DRAWINGS

Embodiments of the invention are further described hereinafter with reference to the accompanying drawings, in which.

DETAILED DESCRIPTION

The described example embodiment(s) relate(s) to flexible electronic structures, which may be or comprise integrated circuits (ICs). In particular, certain embodiments relate to flexible ICs or thin-film ICs suitable for assembly with an external application circuit or other external circuit structure.

Also, the term Integrated Circuit (IC) used in this disclosure may be interpreted very broadly, and the nature of ICs and other products described may be extremely diverse. Any item comprising an electronic component and exhibiting some electronic activity is in scope. ICs may include but are not limited to digital ICs, analogue ICs, mixed-signal ICs, microprocessors, digital signal processors (DSPs), logic ICs, microcontrollers, interface ICs, programmable logic devices, application-specific ICs (ASICs), RFID ICs, RF ICs, memory ICs, sensors, power management circuits, operational amplifiers, data acquisition ICs, clock/timing ICs etc., but also any suitable active and/or passive electronic components.

Furthermore, throughout the specification, the term "connected" is understood to mean a direct connection such as electrical, mechanical or magnetic connection between the things that are connected. The term "coupled" is understood to mean a direct or indirect connection (i.e. through one or more passive or active intermediary devices or components). Further, unless otherwise specified, the use of ordinal adjectives, such as, "first", "second", "third" etc. merely indicate that different instances of like objects are being referred to and are not intended to imply that the objects so described must be in a given sequence, either temporally, spatially, in ranking or in any other manner. Orientation terminology, such as, "horizontal" is understood with respect to a plane parallel to the conventional plane or surface of a wafer or substrate, regardless of the orientation of the wafer or substrate. The term "vertical" may refer to a direction perpendicular to the horizontal as defined previously. Prepositions, such as, "on", "side", "higher", "upper", "lower", "over", "bottom" and "under" may be understood with respect to the conventional plane or surface being on the top surface of the wafer or substrate, regardless of the orientation of the electrical interconnects or the electronic package.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Figure 1A:
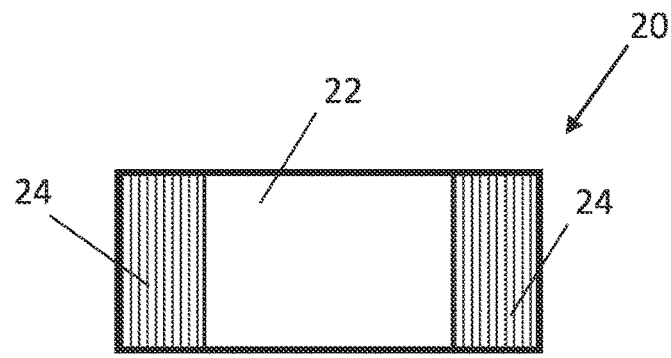
FIGS. 1A, 1B and 1C show a schematic illustration of a flexible electronic structure.
Figure 1B:
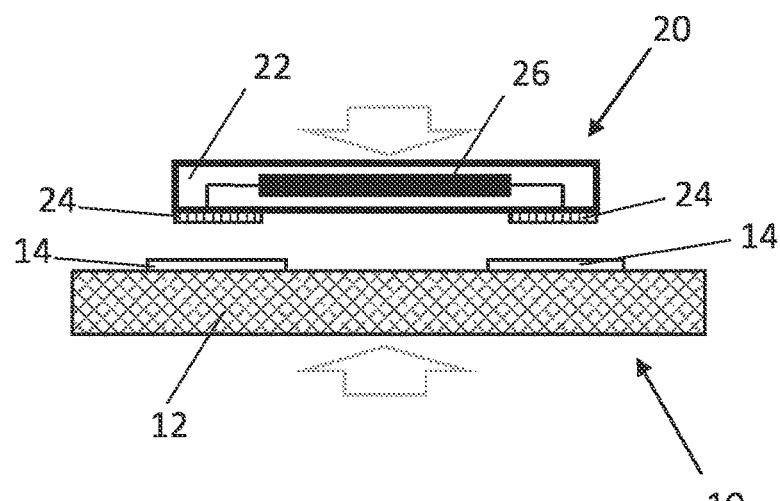
Figure 1C:
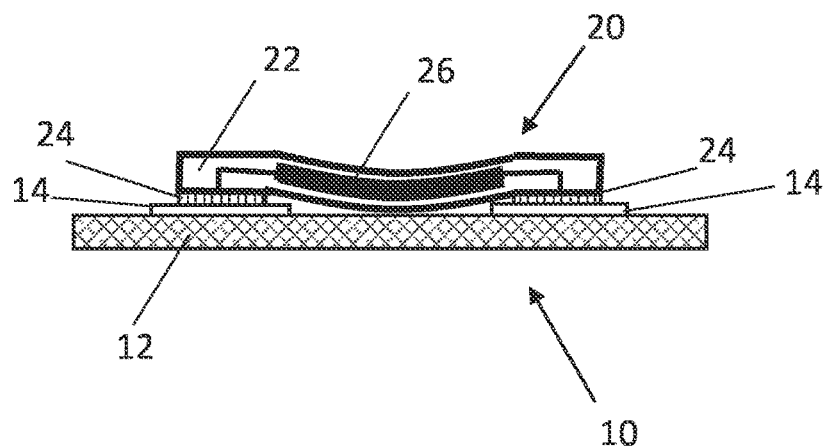
Figure 2A:
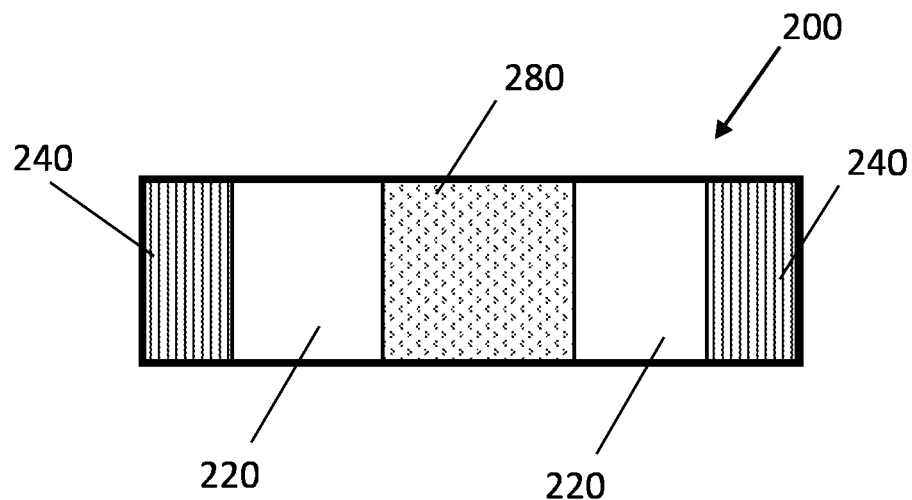
FIGS. 2A and 2B show a schematic illustration of a flexible electronic structure having a support element according to an embodiment of the present disclosure.
Figure 2B:
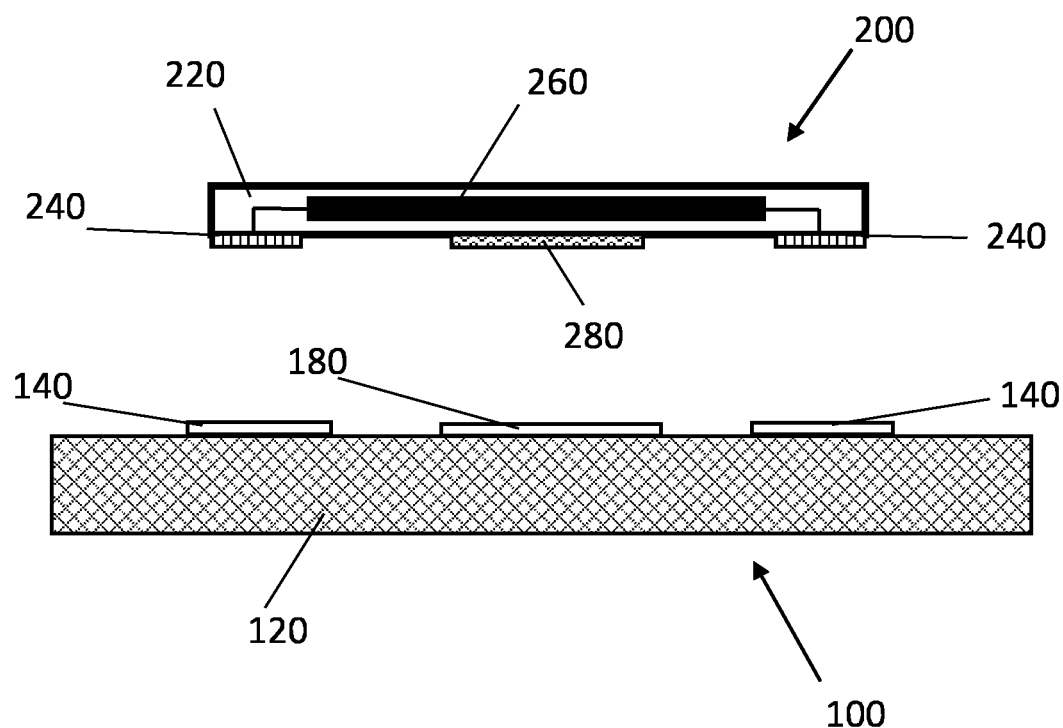

FIGS. 2A and 2B show a schematic illustration of a flexible electronic structure 200 according to an embodiment of the present disclosure. The flexible electronic structure 200 may be a thin-film IC, however it is not limited to such as discussed above.

Referring to FIGS. 2A and 2B, the flexible electronic structure 200 is shown in detail. The flexible electronic structure 200 includes a flexible body 220, two contact elements 240 (it will be appreciated that more contact elements may be included in the flexible electronic structure 200), at least one electronic component 260, and a support element 280 (as discussed later, more than one support element may be included). Additionally, an external structure 100 is shown in detail in FIG. 2B. The external structure 100 (which itself may be rigid or flexible, and which may be or comprise an application circuit) comprises an external substrate 120 (may also be referred to as an application substrate), external contact elements 140 and an external support element 180.

According to certain embodiments, the flexible electronic structure 200 may be formed by initially depositing a blanket layer of conductive material, having substantially constant thickness, across the whole of a flexible substrate comprising electronic component(s) 260. It will be appreciated that various deposition techniques may be used for this, as illustrated (non-limitingly) in Table 1 below. Subsequently, using a subtractive technique, areas of the conductive layer are removed to define a pattern in said material. One example of a suitable subtractive technique is photolithography, which enables patterning to a high degree of precision and with a high quality, allowing for the definition of features having sizes comparable to the wavelength of light used in the process. Other exemplary techniques for defining patterns in the conductive layer of the flexible electronic structure 200 are laser ablation and printing. By such subtractive techniques as described above, contact element(s) and support element(s) may be provided (or patterned) on the flexible electronic structure 200.

Table 1 below provides a non-exhaustive summary of the commonly used fabrication techniques (i.e. different combinations of deposition and patterning techniques) that may be used in the fabrication of the various conductive layer structures/arrangements explained above. In Table 1, the ticks and crosses indicate the compatibility or incompatibility of the various deposition and patterning techniques respectively.

TABLE 1

| Deposition Technique | Patterning Technique | | | | |
|---|---|---|---|---|---|
| | Photolithography & Etching | Printing | Laser Ablation | Demetalisation | Milling |
| Physical Vapour Deposition (PVD) | ✓ | X | ✓ | ✓ | ✓ |
| Seeding/ Electroplating | ✓ | X | ✓ | ✓ | ✓ |
| Printing: Conductive ink on conductive layer | X | ✓ | X | X | X |
| Printing: Conductive ink as conductive layer | X | ✓ | X | X | X |
| Printing: conductive adhesive | X | ✓ | X | X | X |

Each of the different combinations of deposition and patterning techniques may have their own advantages and disadvantages, therefore making them more or less suitable for their application to the fabrication of the conductive layer. For example, the printing of conductive ink as the conductive later may avoid the need for separate deposition and patterning steps and reduce the chance of damage being inflicted on underlying layers of the flexible electronic structure, but may be of limited precision, thus possibly reducing its suitability for forming more detailed, or smaller-scaled, conductive layer structures. Alternatively, some deposition techniques may be better suitable for the formation of a thicker conductive layer, and some patterning techniques may be better suitable for flexible electronic structures where underlying functional components are susceptible to damage from patterning.

According to certain embodiments, the contact elements 240, the support element 280, the external contact elements 140 and/or the external support element may be formed of a conductive ink. In an embodiment, a conductive ink may be used as the metal layer for both the flexible electronic structure 200 (such as in a printed ink redistributive layer) and an external circuit included in the external structure 100.

In FIGS. 2A and 2B, the contact elements 240 (or bond pads) are shown to be provided at opposing sides of the flexible electronic structure 200 and up to the edges of the flexible electronic structure 200. However, it will be appreciated that one or both of the contact elements 240 may be provided elsewhere on the surface of the flexible electronic structure 200. Furthermore, the contact elements 240 may have the same or different sizes and shapes as one another. The contact elements 240 may be provided in the conductive layer of the flexible electronic structure 200, for example a redistributive layer (RDL), through a subtractive technique as discussed above.

In certain embodiments, the contact elements 240 may be provided to correspond to external contact elements 140 (or contact pads) on a first surface of the external structure 100 (or of the external substrate 120) such that, after bonding, the contact elements 240 will operably interface with a circuit included in the external structure 100, thereby operatively coupling the at least one component 260 to the circuit of the external structure 100.

The contact elements 240 are provided on the flexible body 220, specifically on a first surface of the flexible body 220. Also provided on the first surface of the flexible body 220 is the support element 280; for example, the support element 280 may be provided on a predetermined portion of the flexible body 220. In certain embodiments, an external support element 180 (which may also be regarded simply as a surface element of the external structure 100) is provided on the external structure 100 to correspond to the support element 280 such that alignment of the contact elements 240 and the external contact elements 140 also results in substantial alignment of the support element 280 and the external support element 180.

According to certain embodiments, the support element 280 is provided in the same layer of the flexible electronic structure 200 as the contact elements 240. For example, if the contact elements 240 are formed in the RDL, the support element 280 is also provided in the RDL. According to other embodiments, both the support element 280 and the contact elements 240 may be formed from a patterned curable fluid conductive and adhesive RDL, e.g. a conductive ink. Referring to the above, the support element 280 may be provided (or patterned) on the surface of the flexible electronic structure 200 through a subtractive technique (such as used for patterning the contact elements 240).

The support element 280 is to mitigate, or prevent, unwanted deformation of the flexible electronic structure 200 resulting either from the bonding process or in use. For example, during the bonding process (for bonding the contact elements 240 to the external contact elements 140 or, more generally, for bonding the flexible electronic structure 200 to the external structure 100), the support element 280 may contact the external support element 180 and so provide support to the portion of the flexible electronic structure 200 on which the support element 280 is disposed. Furthermore, the support element 280 may bond to the corresponding external support element 180 via sintered metallic ink or a curable fluid combining conductive and adhesive properties (for example a conductive adhesive comprising conductive silver, copper, nickel or graphite particles suspended in an adhesive component comprising a varnish, silicone, synthetic resin or polyurethane), thereby providing further planarising support for the flexible electronic structure 200.

In some examples one or more, or all, of the external contact element(s) 140 and external support element(s) 180 may comprise conductive metallic ink. In other examples one or more, or all, of the contact elements 240 and support element 280 may comprise conductive metallic ink. In yet other examples one or more, or all, of the external contact elements 140 and external support elements 180, and one or more, or all, of the contact elements 240 and support elements 280, may comprise conductive metallic ink. In these examples, the same or different inks may be used to form contact and/or support elements of the flexible electronic structure 200 (240, 280) and of the external structure 100 (140, 180). For example, all of the external contact elements 140 and external support elements 180 of the external structure 100, and all of the contact elements 240 and support elements 280 of the flexible electronic structure 200, may comprise the same conductive metallic ink. Using the same ink for the elements of both structures may provide a homogeneous bond and electrical connection between them. Regardless of whether the same or different inks are used for the elements on both structures, one or neither of the inks may be sintered prior to the structures being joined. As an example, an antenna comprising external contact elements 140 and external support elements 180 may be printed onto an external substrate 120 using a first conductive ink. An RDL layer comprising contact elements 240 and support elements 280 may be printed onto a flexible body 220 using a second conductive ink, which may then optionally be sintered. The external structure 100 and flexible electronic structure 200 may then be aligned and their respective contact elements and respective support elements may be joined by sintering (such a procedure may be further understood by reference to FIGS. 4A and 4B, which illustrates an example involving an antenna element of the external structure 100).

An example of such a bonding process between the flexible electronic structure 200 and the external structure 100 is as follows. Initially, the external support element 180 is provided on the external substrate 120 between the external contact elements 140, and the support element 280 is provided on the first surface of the flexible electronic structure 200 between the contact elements 240 in a suitable location for the purposes of alignment with the external support element 180 (as discussed in more detail above). A layer of conductive metal ink is deposited onto the external substrate 120 to form the contact elements 140 and the external support element 180 of the external structure 100. This deposition may be achieved, for example, by inkjet printing, screen printing etc. (i.e., any suitable method as would be understood by the skilled person).

An important consideration during this process is that the contact elements 240 should not be shorted by the conductive ink, as may occur due to the isotropic nature of the ink's conduction once sintered and cured. This may be achieved, for example, by following design rules (e.g. minimum and/or maximum separations, minimum and/or maximum dimensions, etc.) for the contact elements 240, the support element 280, the external contact elements 140 and the external support element 180, taking into account the properties and thickness of the conductive and adhesive fluid used in the bonding process (if applicable), the curing conditions etc.

Another example approach to avoid shorting of the contact elements 240 is to use a thermoplastic passivation layer coated either on the flexible electronic structure 200 or external structure 100 (or the external substrate 120 thereof): during the sintering or curing process, the thermoplastic moulds around the support element 280 then resets after cooling to provide a planarized underfill between the flexible electronic structure 200 and the external structure 100 (or the external substrate 120 thereof). This underfill provides yet further support for the flexible electronic structure 200, in addition to that provided by the bonded contact elements 240 and the bonded support element 280. Conventional underfill materials and techniques may alternatively be employed for this purpose.

The flexible electronic structure 200 and the external structure 100 are aligned and pressed together (for example, using thermodes), and the flexible electronic structure 200 and the external structure 100 are joined by sinter-bonding. As a result, an electrical contact is formed between each of the contact elements 240 and a respective external contact element 140. The support element 280 may also be bonded to the external support element 180 through this process. As an example of the sinter-bonding, once the flexible electronic structure 200 and the external structure 100 are aligned, there is provided an initial heating or drying step, followed by an application of heat and pressure to sinter bond the support element 280 to the external support element 180 and the contact elements 240 to the external contact elements 140. The temperature and duration of the initial heating/drying step, the temperature of the heat for sinter-bonding, the magnitude of the pressure for sinter-bonding and the duration of the sinter-bonding step are determined as a function of at least one of the chemical properties of the conductive ink and the materials from which the external substrate 120 and flexible electronic structure 200 are composed. The physical properties of such bonds may be improved by increasing the roughness of one or both ink surfaces. For example, the electrical conductivity and/or density requirements for the contact elements 240 and support elements 280 may be less severe than those for the external contact elements 140 and external support elements 180. To give some non-limiting examples: ink drying temperatures may range from ambient temperatures to 200° C., ink drying duration may range from 1 second to 10 minutes, ink sintering temperatures may range from ambient temperatures to 400° C., ink sintering durations may range from 1 second to 100 minutes, and ink sintering pressures may range from ambient pressures to 50 MPa.

In certain embodiments, the support element 280 may comprise one or more of a metal and a non-metallic material (such as a polymer, a metal-oxide etc). In a preferred example, the support element 280 is at least partly metallic. According to certain examples, the support element 280 comprises the same material(s) as the external support element 180.

In certain embodiments, the support element 280 may be thermally coupled to another part of the flexible electronic structure 200, such as the at least one electronic component 260. Accordingly, the support element 280 may provide an effect of heat spreading or heat sinking for the part to which it is coupled. For example, the support element 280 may function as a heat sink for one or more electronic components. Once the flexible electronic structure 200 and the external structure 100 are bonded, the external support element 180 may contribute to such thermal functionality.

In certain embodiments, the support element 280 may be electrically coupled to one or more electronic components in the flexible electronic structure 200, such as the at least one electronic component 260. Accordingly, the support element 280 may provide a reference plane for the one or more electronic components to which it is electrically coupled. Once the flexible electronic structure 200 and the external structure 100 are bonded, the external support element 180 may contribute to such electronic functionality.

In certain embodiments, the support element 280 may provide optical shielding of the at least one electronic component 260 (e.g. memory cells) to prevent or inhibit discovery of the circuit details (e.g. memory cell content). Furthermore, the support element 280 may be configured to provide shielding to electro-magnetic interference (EMI) or radiation (e.g. ionising radiation such as α-particles, β-rays or γ-rays, or non-ionising radiation such as RF, microwave or terahertz waves). In particular, the support element 280 may comprise a predetermined patterning (e.g. patterned contact layout) adapted to minimise EMI, and/or, the support element 280 may be made of, or covered with, a material suitable to minimise EMI and/or radiation. Once the flexible electronic structure 200 and the external structure 100 are bonded, the external support element 180 may contribute to such electromagnetic or radiation functionality.

It will be appreciated that a support element 280 may provide any combination of the above-described functionality; for example, a support element 280 may, in addition to providing support to at least a portion of the flexible electronic structure 200, also provide heat sinking or heat spreading for an electronic component and provide a reference place to an electronic component.

Although the support element 280 is shown to be provided approximately in the middle of the flexible electronic structure 200 in FIGS. 2A and 2B, it will be appreciated that this is not required, and the support element 280 may be located on any part of the flexible electronic structure 200 with the exception of the contact elements 240. That is, the support element 280 could be located on any other region of the first surface of the flexible electronic structure 200 aside from the regions where the contact elements 240 are located.

Optionally, the flexible electronic structure 200 may also comprise a shield element (not shown). The shield element may be provided on the first surface between one of the contact elements 240 and the support element 280, so as to protectively cover at least part of the flexible body 220. In some examples, the shield element is electrically isolated from the contact elements 240, as well as from the at least one component 260.

The shield element may be formed in a metal layer provided on the first surface of the flexible electronic structure 200: for example, the metal layer used for forming the contact elements 240 and the support element 280 may be utilised to provide the shield member. The thickness of the metal layer used for the shield element is chosen so as to provide sufficient structural protection against anticipated damage, such as may arise, for example, due to conductive particles in an ACA (which may be several μm in diameter) being pressed, during bonding, into the circuit component(s) of the flexible electronic structure 200, thus, potentially causing structural damage, short circuits, open circuits and/or other damage to the flexible electronic structure. Further, the thickness of the metal layer may be configured to project from the insulating first surface of the flexible electronic structure 200, so as to provide a 'stand-off' distance between the first surface (e.g. the insulating layer of polymer or passivation) of the flexible electronic structure 200 and the external structure 100.

In certain embodiments, the shield element and the support element 280 may be combined, such that a further purpose of the support element 280 is to protect the flexible electronic structure 200 from damage such as discussed above. That is, the support element may provide a shielding function, instead of providing a separate shield element. In some examples, it will also be appreciated that a plurality of shield elements may be provided for the flexible electronic structure 200, and they may be of the same or differing sizes.

In certain embodiments, an insulating layer may be provided so as to cover at least some of the shield element(s) provided on the flexible electronic structure 200, for example, to prevent said shield element(s) from short-circuiting conductive features on the external structure 100.

Figure 3A:
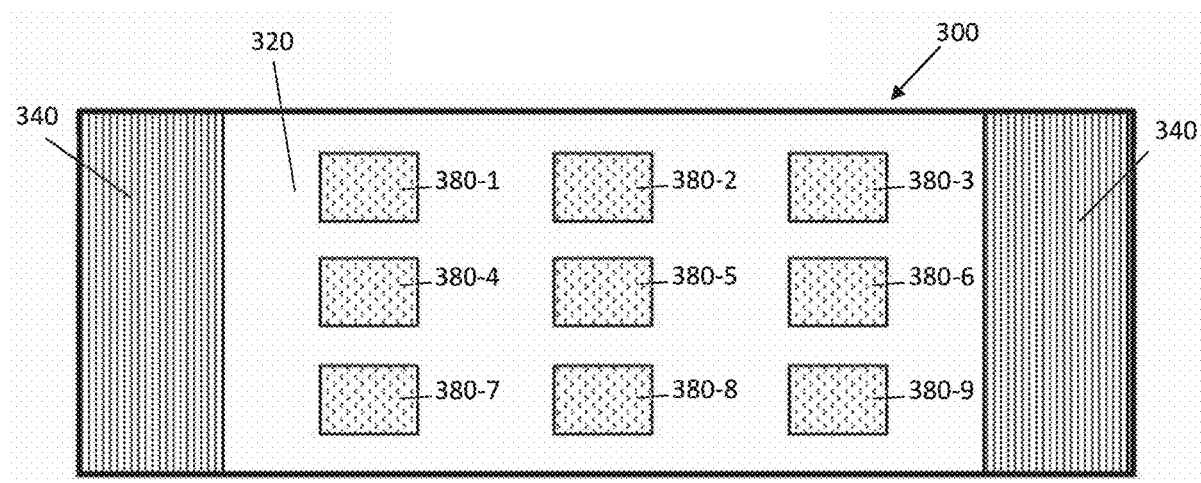
FIGS. 3A, 3B and 3C show schematic illustrations of flexible electronic structures having support elements according to further embodiments of the present disclosure.
Figure 3B:
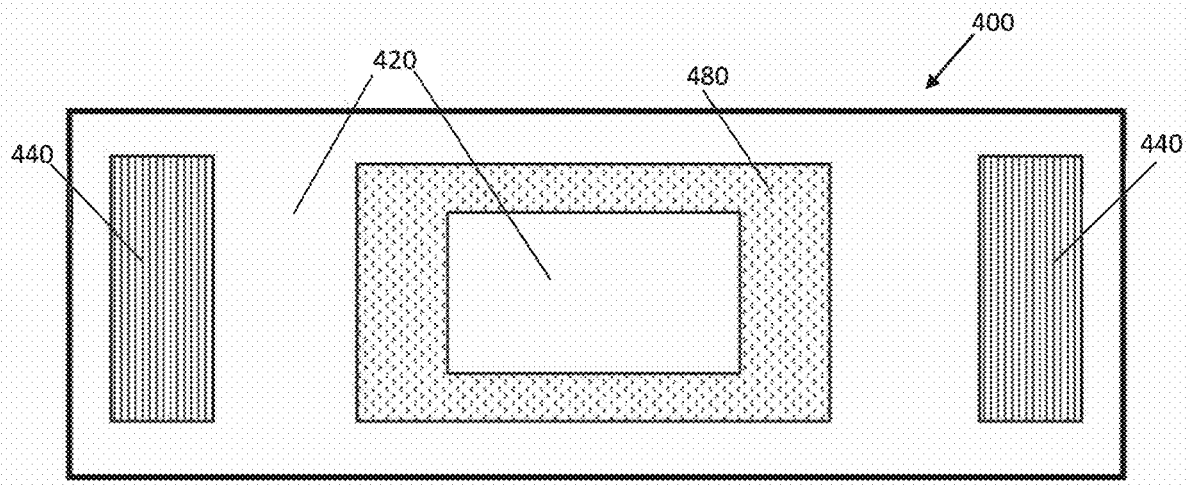
Figure 3C:
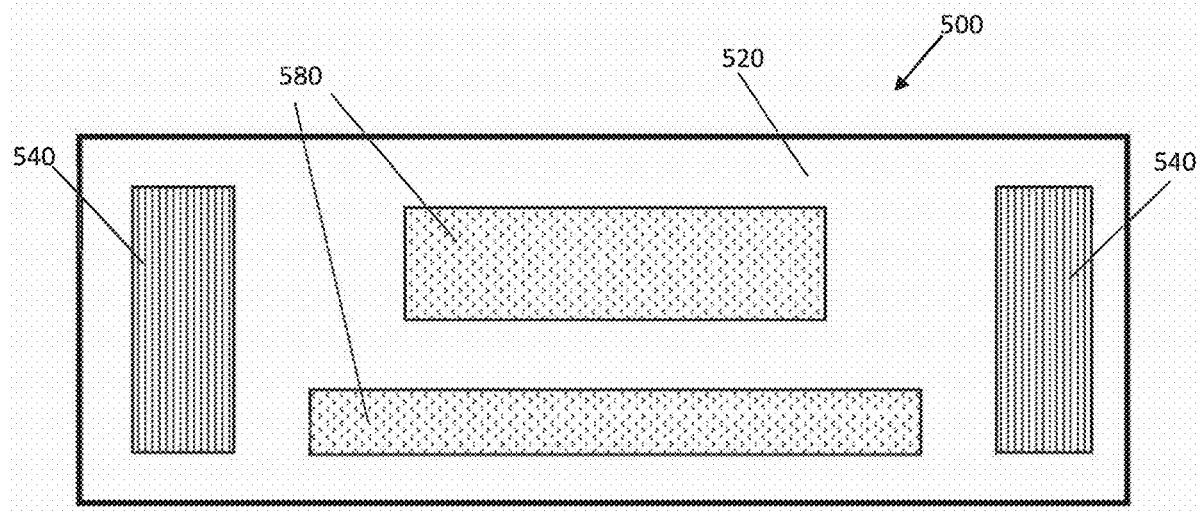

FIGS. 3A, 3B and 3C illustrate different flexible electronic structure configurations, where the number, shape and location of the support element(s) differ from each other and from that shown in FIGS. 2A and 2B. It is also shown how different shapes and locations of contact elements may be provided.

Referring to FIG. 3A, in an embodiment of the present disclosure, a plurality of support elements 380-1 to 380-9 are provided on a first surface of a flexible electronic structure 300. As can be seen, the support elements 380-1 to 380-9 are arranged in a 3×3 array, however it will be appreciated that other configurations are possible; the support elements 380-1 to 380-9 may be provided wherever support is desired.

In certain embodiments, it will be appreciated that a corresponding external support element may be provided for each of the support elements 380-1 to 380-9, on the external structure. Alternatively, fewer external support elements may be provided, however the shape and/or location of the external support elements may be adapted such that each of the support elements 380-1 to 380-9 contact at least one of the external support elements as a result of the bonding process.

All of the support elements 380-1 to 380-9 or only a subset of the support elements 380-1 to 380-9 may be thermally and/or electrically coupled to a part or electronic component of the flexible electronic structure 300 as discussed above in relation to the support element 280 of FIGS. 2A and 2B. For example, support elements 380-1, 380-5 and 380-9 may each be thermally coupled to one or more electronic components of the flexible electronic structure 300, while support elements 380-7 and 380-3 may be electrically coupled to one or more electronic components.

Referring now to FIG. 3B, there is shown a support element 480 of a flexible electronic structure 400 in a loop shape, such that the support element 480 encloses an uncovered portion of flexible body 420 and is also enclosed by an uncovered portion of flexible body 420. In accordance with the above, in certain embodiments, at any point(s) along the length of the support element 480, the support element 480 may be thermally and/or electrically coupled to one or more electronic components of the flexible electronic structure 400.

FIG. 3B also illustrates a different size and location of contact element 440 compared to that of FIGS. 2A-2B and 3A, in accordance with the above discussion.

Referring now to FIG. 3C, there is shown two support elements 580 having different shapes. It will be appreciated that more support elements having the same or different shapes may also be provided, as desired.

Figure 4A:
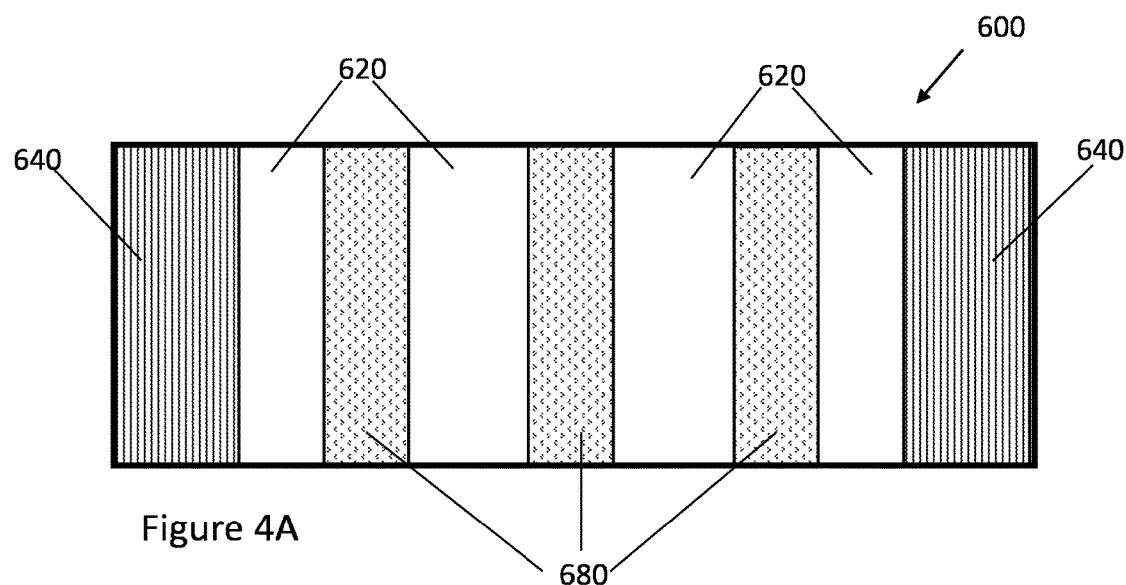
FIGS. 4A and 4B show a schematic illustration of a flexible electronic structure having a support element for a crossover-type application according to a further embodiment of the present disclosure.
Figure 4B:
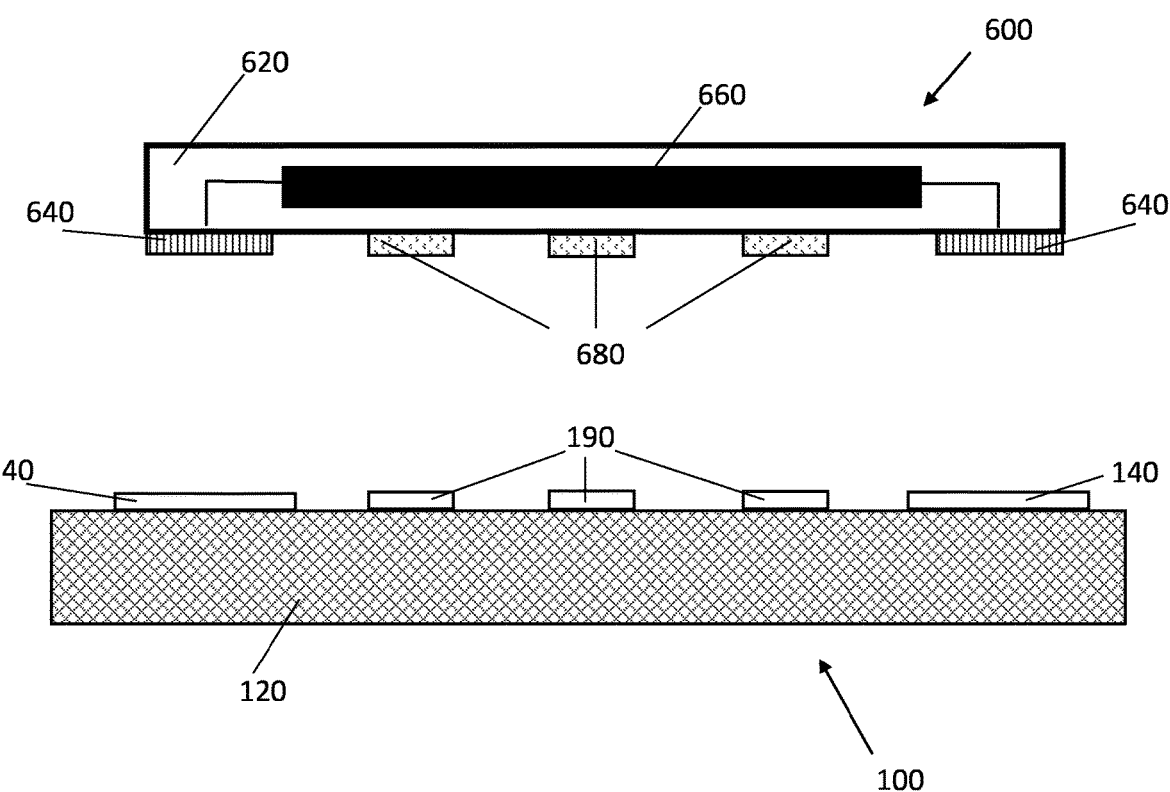

FIGS. 4A and 4B illustrate an embodiment of the present disclosure in which a plurality of support elements 680 are provided to couple to components provided on the surface of the external structure 100. For example, antenna tracks 190 are provided on the external structure 100. As a result of bonding the flexible electronic structure 600 to the external structure 100, the support elements 680 will couple to the antenna tracks 190, and the flexible electronic structure 600 will also be supported by the contact between the support elements 680 and the antenna tracks 190.

In other embodiments, one or more support elements 680 may form a conductive path between electrically isolated sections of one or more antenna tracks 190. In such embodiments a gap or discontinuity may be provided in antenna track 190 (or other conductive feature of external structure 100), this gap is then bridged as a result of bonding the flexible electronic structure 600 to the external structure 100. Such embodiments may enable a wide range of features, for example security elements, distributed capacitances in the bonded circuit, a statistical distribution of resistances related to the density of conductive ink or ACA particles, or unique tag-level characteristics that may be written digitally, e.g. by laser, into the pattern of the support element(s) 680 while allowing low-cost identical antennas to be used. In such embodiments, the flexible electronic structure 600 may not be supported in the areas where the support elements 680 bridge gaps between antenna track sections.

As discussed above, an ACA may be used in the bonding of an external structure to a flexible electronic circuit to achieve electrical connection between the respective contacts. An advantage of using ACA is that it allows the assembly of flexible electronic (circuit) structures and external (circuit) structures without the need for an accurate (and hence time-consuming and/or costly) placement of a conductive adhesive onto the small engaging contacts. In fact, the adhesive (i.e. ACA) may cover the whole area of the flexible electronic structure without the risk of causing a short circuit, because the electrically conductive particles are adapted to only provide a conductive interface between the desired connection of the flexible electronic structure and the external structure. In addition, when using ACA, there is no need to apply an additional non-conductive adhesive to provide mechanical integrity to the flexible electronic structure/external structure assembly.

However, when using ACA for bonding, thermodes are required to apply a relatively high pressure so as to squeeze the adhesive layer (e.g. ACA) provided between the flexible electronic structure and the external structure until the adhesive layer (e.g. ACA) is a little thinner than the diameter of the conductive particles. While this technique works sufficiently well for rigid silicon chips and other rigid or individual flexible circuits, many flexible circuit structures may only have a relatively soft and/or very thin (e.g. <1 µm) protective layer between the embedded circuitry and the adhesive layer (e.g. ACA).

Consequently, there is a danger of the conductive particles (which may be several µm in diameter) to be pressed into the flexible circuit structure's circuit component(s), thus, potentially causing structural damage, short circuits, open circuits and/or other damage to the flexible circuit structure. It is noted that certain embodiments described above refer to implementing a shield element to mitigate, or entirely prevent, this damage.

Figure 5A:
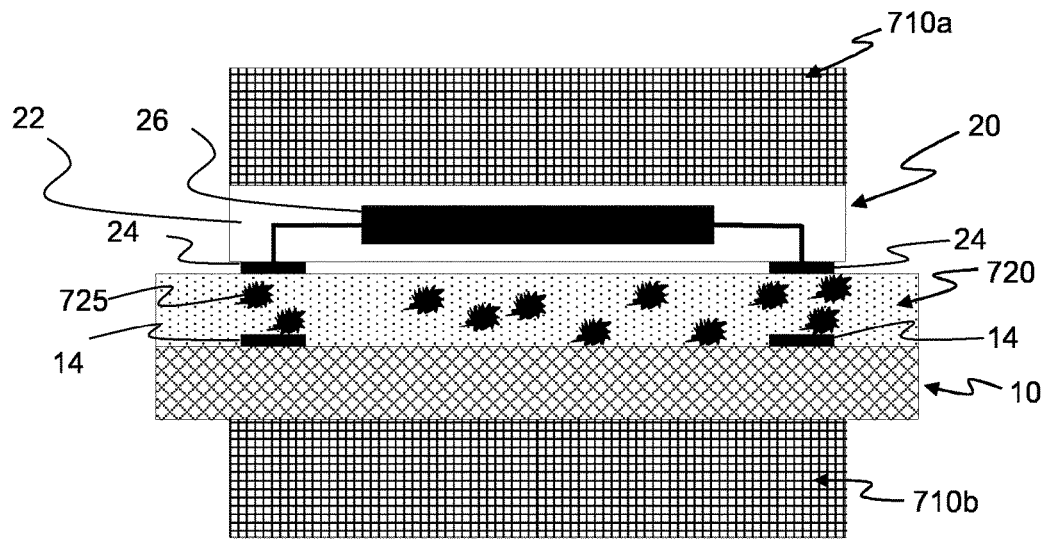
FIGS. 5A and 5B provide a schematic illustration of a bonding process between a thin-film IC and an external structure.
Figure 5B:
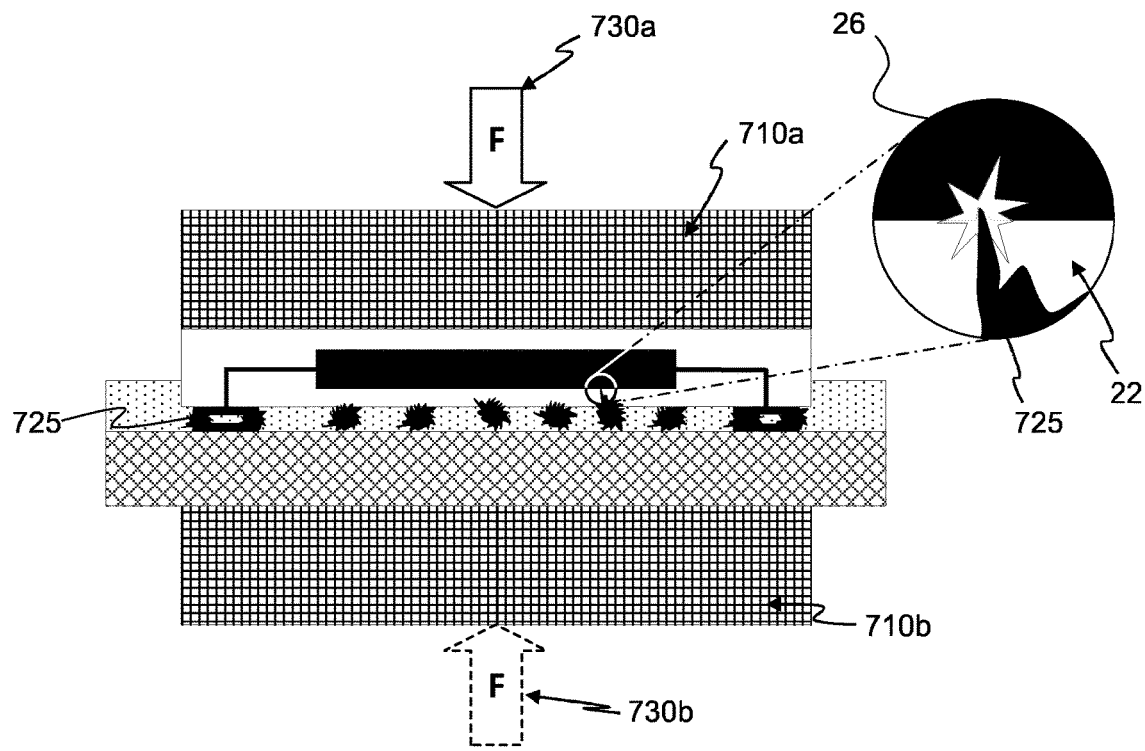

FIGS. 5A and 5B show a simplified illustration of the described bonding technique using thermodes 710a, 710b and an ACA layer 720 to operably attach a flexible electronic structure (i.e. a flexible or thin-film IC) 20 to an external structure 10 (e.g. an application circuit or external circuit).

During assembly, the ACA 720 is provided between respective interface surfaces (each comprising respective ones of circuit contact elements 14, 24) of the external structure 10 and the flexible electronic structure 20, wherein an upper thermode 710a and a lower thermode 710b are placed on respective outer surfaces of the flexible electronic structure 20 and the external structure 10. Upper and lower thermode 710a, 710b provide a predetermined force by pressing the flexible electronic structure 20 and the external structure 10 together while applying a predetermined heat energy. Applied heat and pressure cause the ACA 720 to flow so that conductive particles 725 are trapped between corresponding contact elements 14, 24, thus, forming a localised electrical connection between corresponding contact elements 14 and 24.

However, as illustrated in FIG. 5B, under pressure (and heat) represented by arrows 730a and 730b, conductive particles 725 may penetrate the outer surface of the flexible electronic structure 20, and the flexible body 22 thereof, potentially damaging the internal components 26 of the flexible electronic structure 20. These potential damaging penetrations may also be protected against using the conductive layer to shield areas of the flexible electronic structure 20 as previously described above.

In some examples, as described above and in reference to FIGS. 4A and 4B, one or more support elements 680 may form a conductive path between electrically isolated sections of one or more antenna tracks 190. In such examples a gap or discontinuity may be provided in antenna track 190 (or other conductive feature of external structure 100), this gap is then bridged as a result of bonding the flexible electronic structure 600 to the external structure 100. Such embodiments may enable a wide range of features, for example security elements, distributed capacitances in the bonded circuit, a statistical distribution of resistances related to the density of conductive ink or ACA particles, or unique tag-level characteristics that may be written digitally, e.g. by laser, into the pattern of the support element(s) 680 while allowing low-cost identical antennas to be used. In such examples, during bonding the pressure on the bonding surfaces of the flexible electronic structure 600 and external structure 100 may be reduced in the region of the gap in the conductive feature of the external structure 100, because the support element(s) 680 are pressed into the gap, rather than into a raised conductive feature.

Although the presence of sharp particles in ACA may damage a flexible electronic structure when being bonded to an external structure, in accordance with the present invention sharp and thus potentially damaging structures of either, or both of, the flexible electronic structure or the external structure may be used to reduce the use of ACAs for flexible electronic structures to external structures.

More specifically, the sharp edges that may result from particular patterning techniques of a conductive layer (e.g. RDL or antenna) or sharp edges that have purposely been introduced may be used to replace the need for the presence of conductive particles in the adhesive, thereby allowing for a non-conductive adhesive paste to be used for bonding a flexible electronic structure to an external structure.

Figure 6A:
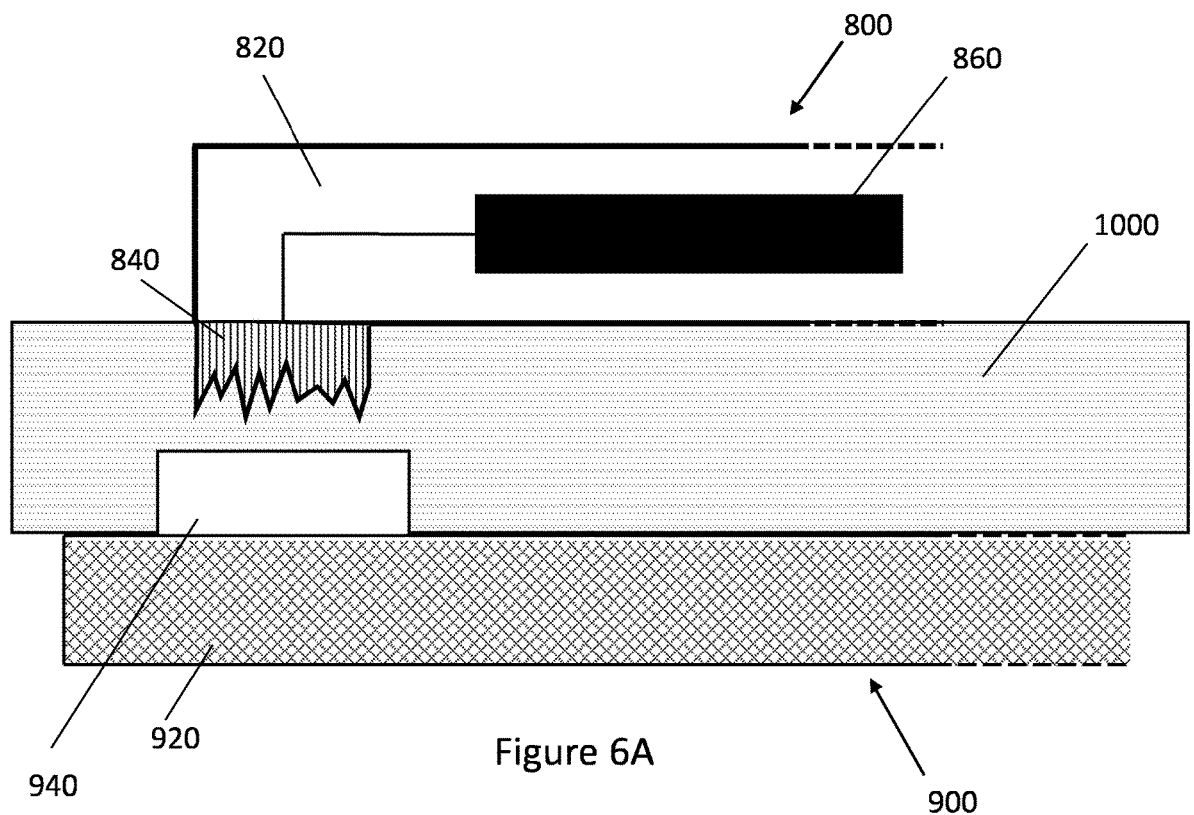
FIGS. 6A and 6B show a schematic illustration of respective contact elements of a flexible electronic structure and an external circuit structure according to an embodiment of the present disclosure.
Figure 6B:
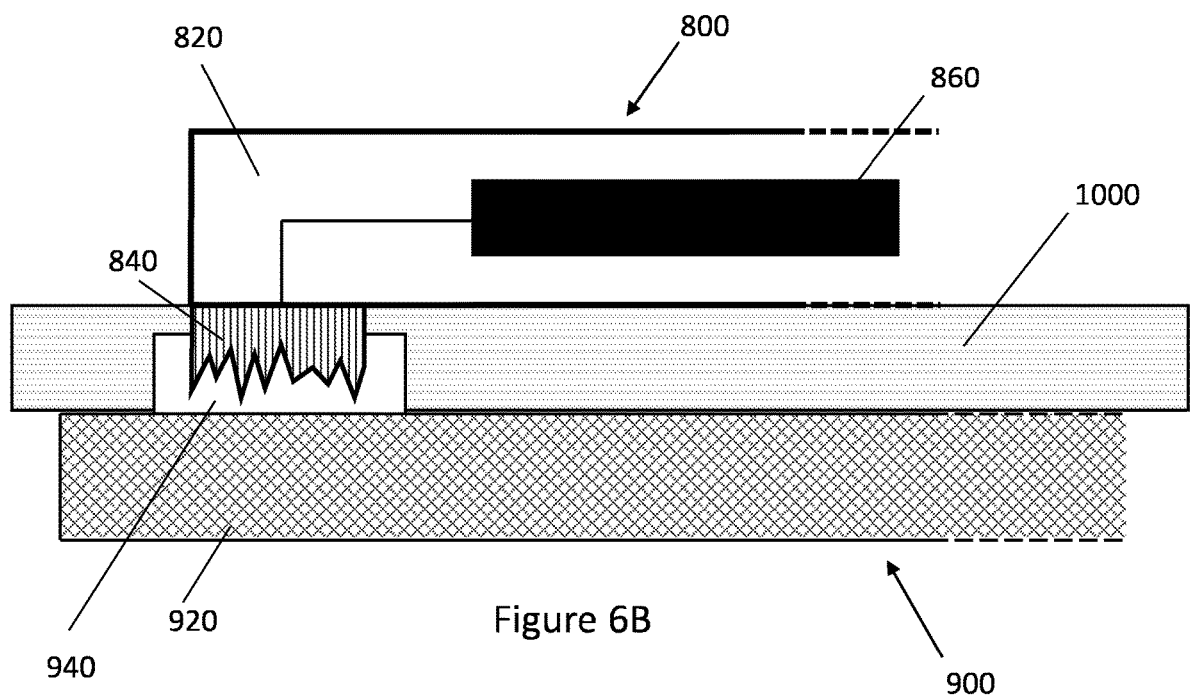

FIGS. 6A and 6B illustrate how sharp protrusions of contact elements that form part of an RDL may be used to achieve electrical connections between a thin-film IC (being used as an example of a flexible electronic device) and an application circuit (being used as an example of an external structure). The illustrated portion of thin-film IC 800 comprises a flexible body 820, a contact element 840 (more of which may be present in the thin-film IC 800 as a whole), and at least one electronic component 860. The illustrated portion of the application circuit 900 comprises an external substrate 920 and an external contact element 940 (more of which may be present in the application circuit 900 as a whole)

FIGS. 6A and 6B show a zoomed-in portion around one contact element 840 of the thin-film IC 800 and corresponding external contact element 940 of the application circuit 900, however it will be appreciated that the features described below may be applied to other contact element(s) of the thin-film IC 800, and that the thin-film IC 800 may, in general, have a structure in accordance with any of the flexible electronic structures described above (for example, in accordance with flexible electronic structures 200, 300, 400, 500, 600 of FIG. 2A-2B, 3A-3C or 4A-4B).

In FIG. 6A, a conductive layer has been deposited on an upper surface of a thin-film IC 800 and then patterning used to form contact elements (only one of which is shown for convenience of illustration/description—contact element 840). However, either by virtue of characteristics of the patterning or by design of the patterning or deposition, or by subsequent further processing, the contact element 840 has a sharp protrusion(s). Subsequently, to bond the thin-film IC 800 to the application circuit 900, an adhesive paste 1000 that does not contain conducting particles is placed between the thin-film IC 800 and the application circuit 900, which includes external contact element 940. The thin-film IC 800 and the application circuit 900 are then forced together under heat and pressure by thermodes as disclosed in combination with in FIG. 5B.

FIG. 6B show the result of the bonding process of FIG. 6A. As a result of the pressure, the thin-film IC 800 and application circuit 900 are bonded and the protrusion(s) has penetrated through the adhesive to make contact with the external contact element 940 of the application circuit 900, thus avoiding the need for conductive particles in the adhesive 1000 in order to form the electrical connections between the thin-film IC 800 and the application circuit 900. By virtue of this approach, damage that may be caused by the conductive particles of an ACA may be avoided.

In both FIGS. 6A and 6B, although the external contact element 940 of the application circuit is illustrated as being raised from the surface of the application circuit 900 this may not necessarily be the case and may instead be formed from direct contact with components of the application circuit 900. Not only may electrical contact be achieved through the protrusion(s) penetrating the external contact element 940, but the mechanical contact arising due to said penetration may strengthen the bond between the thin-film IC 800 and the application circuit 900.

Although FIG. 6B illustrates that the sharp protrusions partially penetrate the external contact element 940 of the application circuit 900, they may merely abut the surface of the electrical contacts or make contact in other ways suitable for forming an electrical connection. Furthermore, although the protrusions are illustrated as being part of the RDL of the thin-film IC, the structures may alternatively be part of the application circuit. In yet another alternative, the protrusion(s) may be configured to penetrate through an insulating/passivation/protective layer on the surface of the application circuit or thin-film IC and directly contact an internal component or electrical contact of the thin-film IC or application circuit, thus avoiding the need for dedicated electrical vias.

An example implementation where sharp protrusion(s) on the contact element(s) resulting from fabrication may be used in manner described above is in the connection of antennas to thin-film ICs. More specifically, when fabricating antennas from materials such as aluminium, sharp protrusions, ridges or edges may result (for example, due to a peeling process or burrs from laser etching), which may be used to penetrate an adhesive and/or a protective layer of a thin-film IC in order to make a connection between the thin-film IC and the antenna(s). For example, the fabrication of the antenna may be configured to, or may unavoidably, result in sharp edges or protrusions in particular areas that correspond to either contact elements of the thin-film IC or the output components of the thin-film IC if direct contact through a protective layer of the thin-film IC is desired. Therefore, usually undesirable characteristics of particular fabrication techniques or components may be used to achieve a more robust and simplified bonding process between a thin-film IC and an application circuit.

In an example, the electrical connection to the external circuit formed by the penetration of the protrusions of the contact element(s) into the corresponding external contact element(s), or into the external (application) circuit (or an electronic component thereof), may be for the communication of signals to be transmitted by or received by an antenna of the external circuit, where the antenna may be an RFID, NFC or other wireless short-range communication antenna. For example, this may be implemented in combination with the embodiment illustrated in FIGS. 4A and 4B, which describe antenna tracks being provided on the external support structure 100 as part of the external circuit.

A further example implementation where sharp protrusion(s) on the contact element(s) resulting from fabrication may be used in the manner described above may arise from the printed deposition and patterning of a conductive ink layer. As the ink dries a 'coffee ring effect' may cause the suspended conductive particles to form a pattern and adopt a roughened outer surface. Such a roughened surface of contact elements that form part of an RDL of the flexible electronic structure and/or of an external structure may be used to achieve electrical connections between the flexible electronic structure and an external structure. That is, either the flexible electronic structure or the external structure or both structures may feature roughened contacts formed in printed conductive ink. Such patterned contacts with rough, raised surfaces may "interlock" via penetration with an opposing contact, and/or may provide a further raised area of conductive contact that is more easily exposed and connected, while adhesive is pushed aside. The local roughness within the contact area may cause the adhesive to be more evenly distributed among the contact points, resulting in a more secure network of conductive connection throughout an adhesive matrix on the local scale within the contact area, even in the absence of "cold weld" metal-metal adhesion.

Figure 7A:
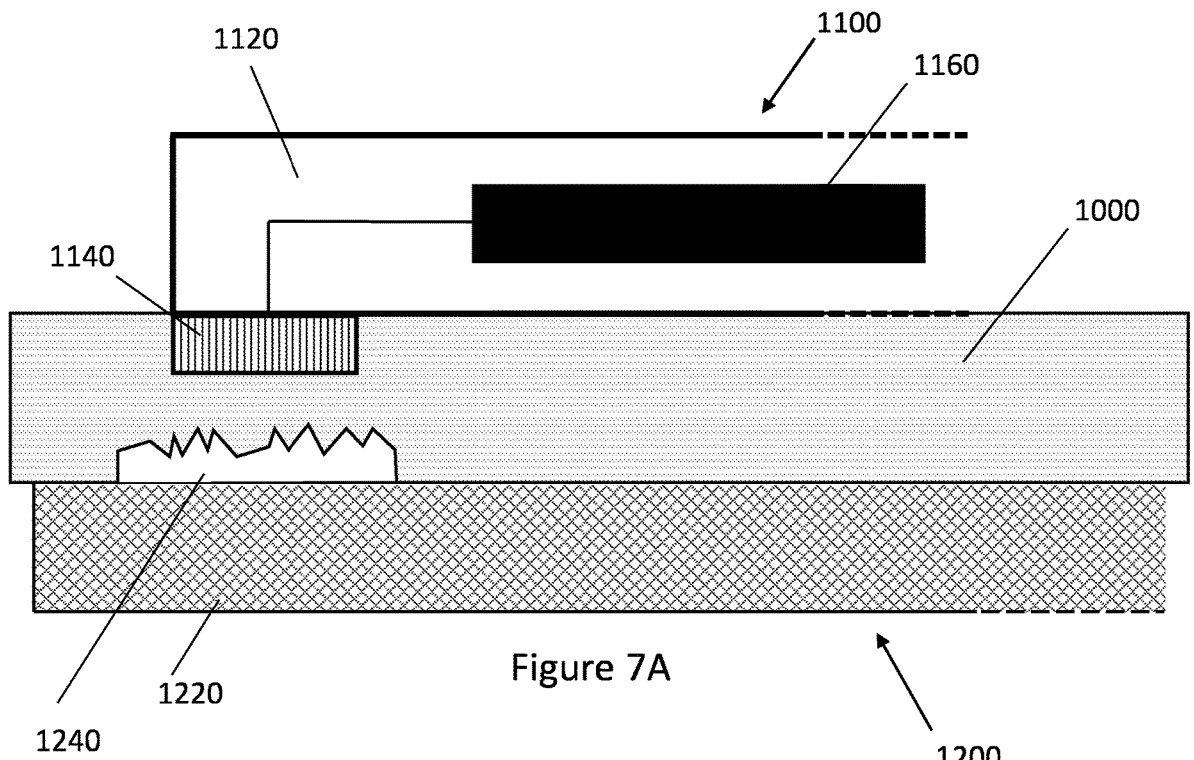
FIGS. 7A and 7B show a schematic illustration of respective contact elements of a flexible electronic structure and an external circuit structure according to another embodiment of the present disclosure.
Figure 7B:
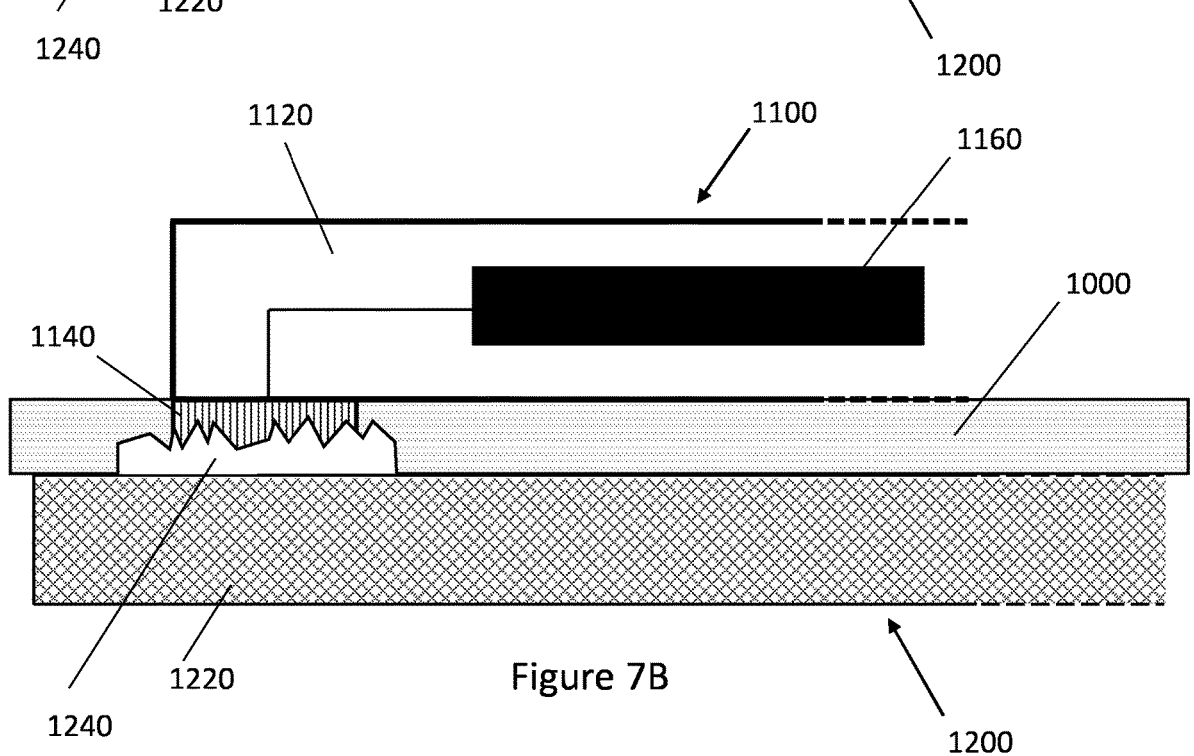

FIGS. 7A and 7B provide an example where the protrusions are formed on one or more external contact element 1240 of the application circuit 1200 (exemplifying an external structure) as a result of its manufacture. As discussed above in relation to FIGS. 6A and 6B, these protrusions may result from the method of forming the external contact element 1240. Analogously to FIGS. 6A and 6B, as a result of pressure applied during the bonding process, the protrusions on the external contact element 1240 penetrate or pierce the corresponding contact element 1140 of the thin-film IC 1100 (exemplifying a flexible electronic structure) through the adhesive, thus avoiding the need for conductive particles in the adhesive 1000 in order to form the electrical connections between the thin-film IC 1100 and the application circuit 1200.

In an example, the electrical connection to the external circuit formed by the penetration of the protrusions of the external contact element(s) into the corresponding contact element(s) may be for the communication of signals to be transmitted by or received by an antenna of the external circuit, where the antenna may be an RFID, NFC or other wireless short-range communication antenna. For example, this may be implemented in combination with the embodiment illustrated in FIGS. 4A and 4B, which describe antenna tracks being provided on the external support structure 100 as part of the external circuit.

Alternative arrangements of the sharp protrusions/structures are also possible, for example, each of the edges of the regions of conductive material may include the sharp protrusions or only a selection of the edges may include the sharp protrusions. For instance, the sharp protrusions may be formed on the edges that are a result of patterning i.e. where material has been removed from.

Features, integers, characteristics or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A flexible electronic structure configured to bond with an external circuit, the flexible electronic structure comprising:
   a flexible body having a first surface, the flexible body comprising at least one electronic component;
   at least one contact element configured to bond with the external circuit, the at least one contact element operatively coupled with the at least one electronic component and provided at the first surface of the flexible body, and arranged to operably interface with the external circuit after bonding, and
   at least one support element provided at the first surface of the flexible body and in direct contact with the first surface of the flexible body, each support element arranged to contact a corresponding surface element disposed on a first surface of an external structure comprising the external circuit,
   wherein the at least one contact element comprises a conductive metallic ink, and the at least one contact element is configured to sinter-bond, via the conductive metallic ink, to a corresponding external contact element disposed on the first surface of the external structure, and
   wherein the at least one support element is thermally connected to the at least one electronic component and provides heat spreading or heat sinking for the at least one electronic component.

2. The flexible electronic structure of claim 1, wherein one or more of the at least one support element, the external circuit and the corresponding surface element comprises a conductive metallic ink.

3. The flexible electronic structure of claim 1, wherein the at least one support element is arranged to provide optical shielding of one or more of the at least one electronic component.

4. The flexible electronic structure of claim 1, wherein the at least one support element is arranged to provide shielding to one or more of electro-magnetic interference and radiation, for one or more of the at least one electronic component.

5. The flexible electronic structure of claim 1, wherein the at least one support element and the at least one contact element are formed on the first surface by printing.

6. The flexible electronic structure of claim 1, wherein the at least one support element and the at least one contact element comprise the same one or more materials.

7. The flexible electronic structure of claim 1, wherein the flexible electronic structure comprises a plurality of contact elements, wherein the at least one support element is provided between two contact elements of the plurality of contact elements.

8. The flexible electronic structure of claim 1, wherein the flexible electronic structure comprises a plurality of support elements, each arranged to contact and electrically connect to a corresponding surface element disposed on the surface of external structure, wherein each surface element is an antenna track.

9. The flexible electronic structure of claim 1, wherein a thermoplastic is provided around the at least one support element to form an underfill between the flexible electronic structure and the external structure.

10. The flexible electronic structure of claim 1, wherein the at least one contact element and the at least one support element are formed in a redistributive layer (RDL) of the flexible electronic structure.

11. The flexible electronic structure of claim 1, wherein each support element is configured to bond with the corresponding surface element via a conductive, adhesive, curable fluid, or via sintered metallic ink.

12. The flexible electronic structure of claim 1, wherein the flexible electronic structure is a thin-film integrated circuit, IC, or a flexible IC.

* * * * *